United States Patent [19]
Pavel

[11] Patent Number: 4,605,275
[45] Date of Patent: Aug. 12, 1986

[54] MODULAR ENCAPSULATED CROSS-CONNECT TERMINAL UNIT

[75] Inventor: Laszlo Pavel, Palatine, Ill.

[73] Assignee: Reliance Electric Company, Cleveland, Ohio

[21] Appl. No.: 708,217

[22] Filed: Mar. 5, 1985

[51] Int. Cl.⁴ .............................................. H05K 5/00
[52] U.S. Cl. ................................... 339/119 R; 29/858; 174/60; 179/98
[58] Field of Search ........................ 179/98; 174/38, 60, 174/52 PE; 361/390, 391, 340, 426, 427, 428, 429; 339/18 R, 18 C, 119 R, 125 R, 198 R, 115 R, 115 C, 117 R, 218 R, 218 M; 29/855, 857, 858

[56] References Cited

U.S. PATENT DOCUMENTS

| | | | |
|---|---|---|---|
| 586,464 | 7/1897 | Tobey | 174/60 |
| 3,420,381 | 1/1969 | Bradfield | 361/429 |
| 3,753,047 | 8/1973 | Shallbetter | 174/60 |
| 4,236,779 | 12/1980 | Tang | 339/156 R |

FOREIGN PATENT DOCUMENTS

| | | | |
|---|---|---|---|
| 905379 | 3/1954 | Fed. Rep. of Germany | 179/98 |
| 3031985 | 3/1982 | Fed. Rep. of Germany | 179/98 |

OTHER PUBLICATIONS

Radio & Television News, Rubberized Circuits for Guided Missiles, p. 116, 2-1957.

*Primary Examiner*—Neil Abrams
*Attorney, Agent, or Firm*—Michael M. Rickin

[57] ABSTRACT

A terminal unit which is both modular and encapsulated is disclosed. The cable stub and cross-connect blocks are connected to the unit. The unit contains hinged panels on which the cross-connect blocks are mounted. The stub pairs are wired to the rear of the blocks. The rear of the blocks and the base wherein the cable stub enters the unit are then encapsulated. The assembled encapsulated modular unit may then be installed in a suitably arranged terminal enclosure.

12 Claims, 5 Drawing Figures

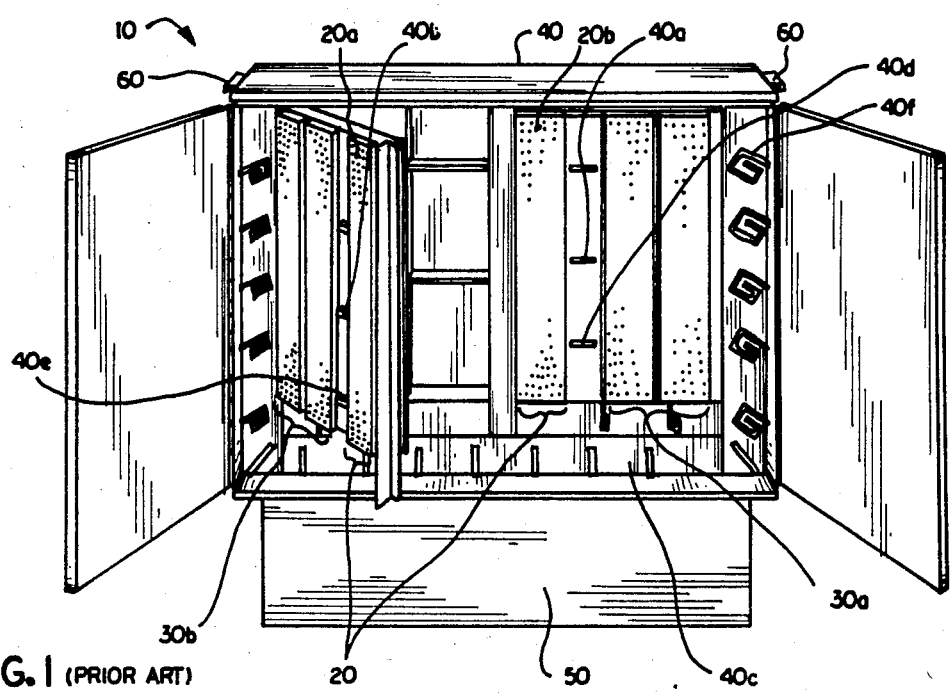
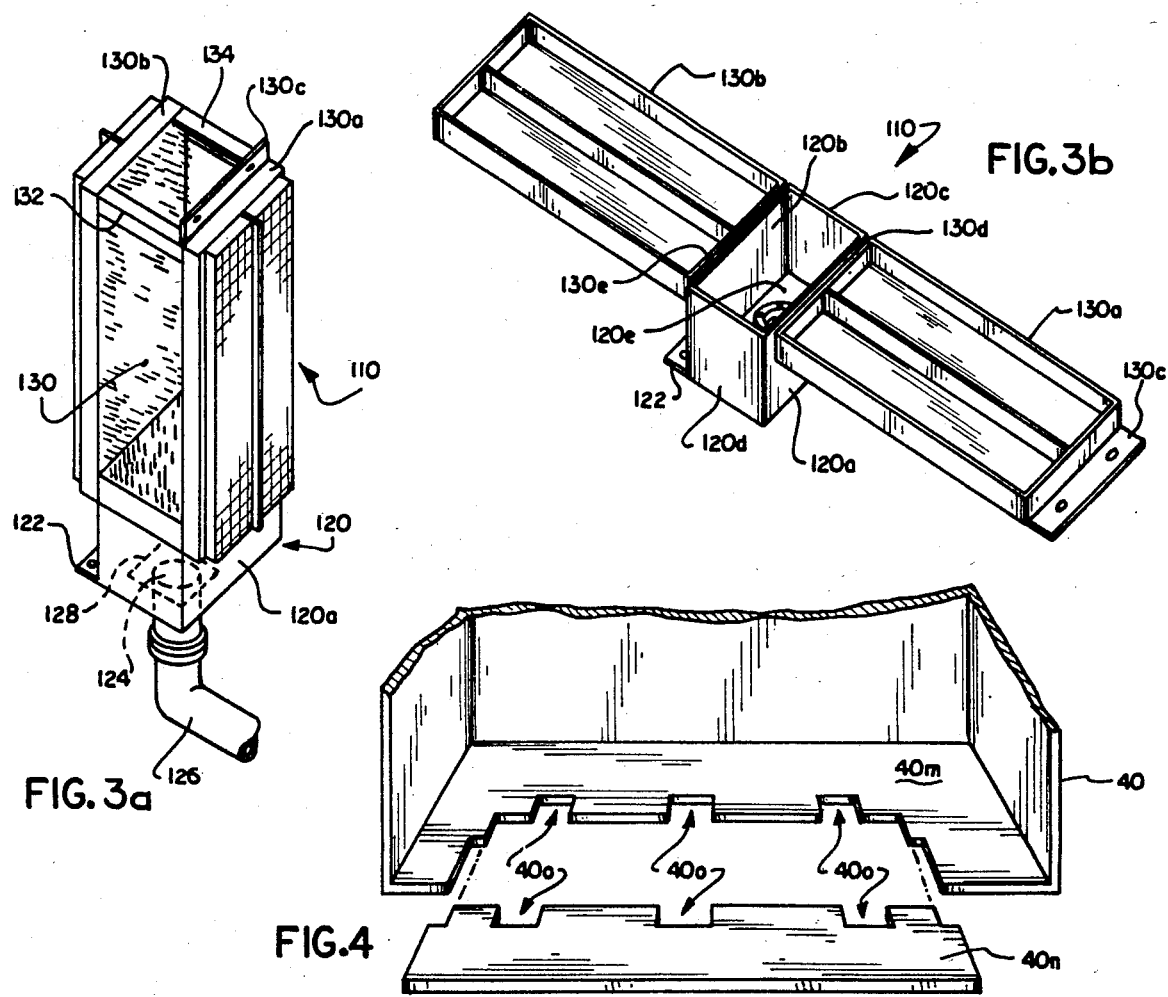
FIG. 1 (PRIOR ART)
FIG. 3a
FIG. 3b
FIG. 4

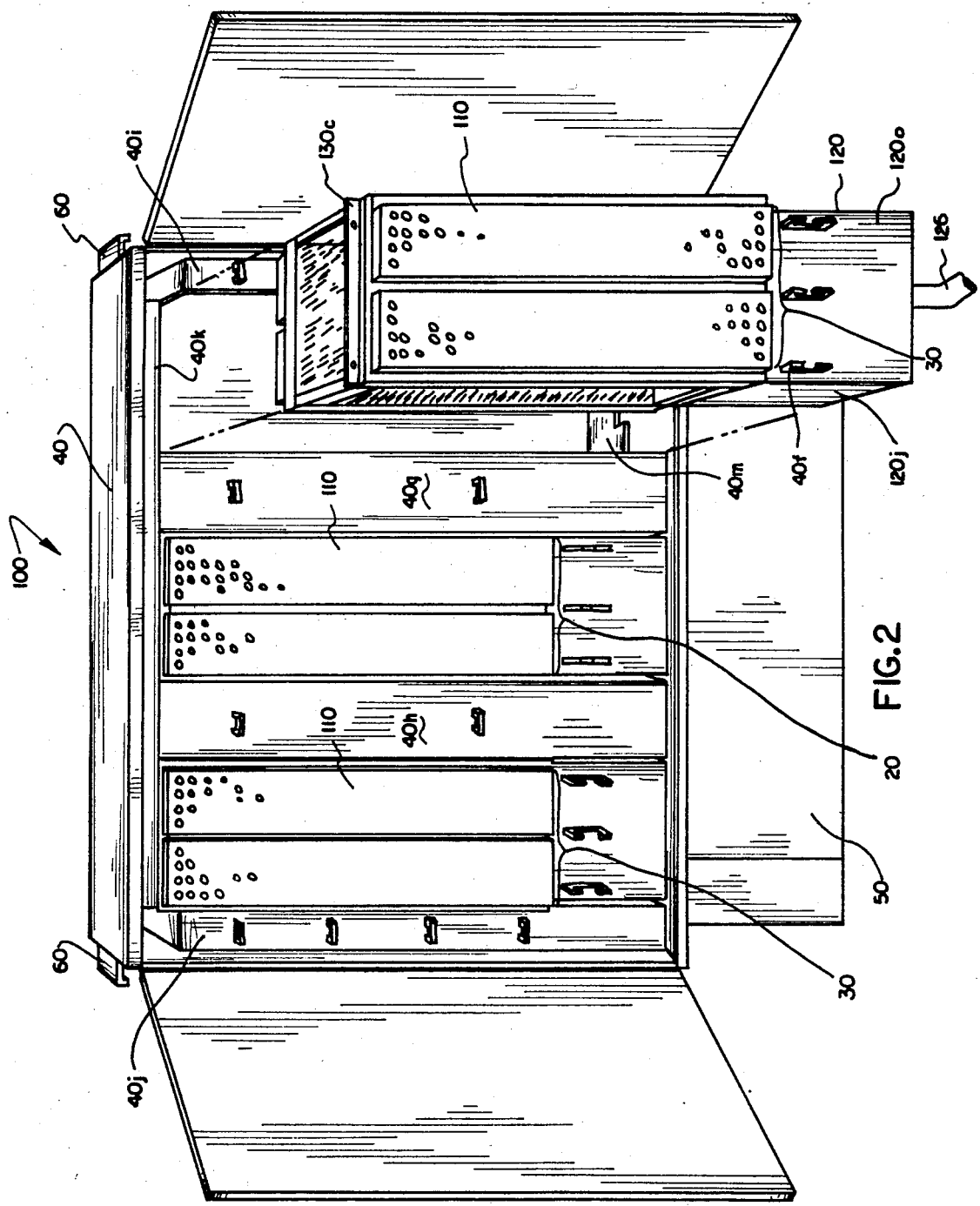

MODULAR ENCAPSULATED CROSS-CONNECT TERMINAL UNIT

BACKGROUND OF THE INVENTION

1. Field of the Invention

This invention relates to cross-connect terminals and more particularly to a modular encapsulated unit adopted for insertion in such a terminal.

2. Description of the Prior Art

Cross-connect terminals provide a means whereby the cable pairs coming from a telephone central office (C.O.) may be interconnected with the cable pairs connected to the subscribers. Cross-connect terminals typically include a multiplicity of terminal blocks arranged in two groups or fields, one of which is designated as the feeder field and the other of which is designated as the distribution field. The C.O. cable pairs are connected to the rear of the blocks in the feeder field. The subscriber cable pairs are connected to the rear of the blocks in the distribution field. Jumper wires connected to the front of the blocks are then used to make the interconnection between the feeder and distribution fields.

In some applications for cross-connect terminals it is advantageous that the connections to the rear of the blocks and the whole cable plant up to and including the cable jacket be encapsulated. Encapsulation protects and maintains the integrity of the connections even if adverse environmental factors such as moisture, rodents, etc. come in contact with the terminals.

In the past units were encapsulated in the field if the same was required. Encapsulation in the field requires that the craftsperson must not only make the necessary connections to the terminal blocks but must also mix and pour the encapsulating material. In performing this task in the field the craftsperson may be working under less than ideal conditions. Therefore improper encapsulation may result. Thus, field encapsulation may not provide the desired environmental protection.

SUMMARY OF THE INVENTION

According to the present invention there is disclosed a modular encapsulated cross-connect terminal unit for mounting in a cross-connect terminal, the terminal forming a housing for receiving the modular unit.

The modular unit is made up of a first part which has an open top enclosure having a bottom with an opening in it and a top peripheral edge. A first panel is connected by a hinge to a part of the top edge. The first panel is mounted for pivotal motion between the vertical and horizontal. It has at least one hollow section in it. A second panel is connected to its associated portion of the top edge in a manner which allows the panel to be at least in the vertical position. At least one connector block is mounted in the hollow section of the first panel such that when the panel is horizontal the rear face of the block points upward.

A cable unit having multiple pairs is mounted to the bottom of the enclosure and projects through the opening. Part of the cable pairs are connected to the rear of the block. The first and second panels are connected to each other to be held in vertical position. The rear of the block and the enclosure are encapsulated.

The modular unit also includes a second part which is attached to the first part. The second part is for mounting the unit in the terminal.

DESCRIPTION OF THE DRAWING

FIG. 1 shows a cross-connect terminal embodied in accordance with the prior art.

FIG. 2 shows the modular encapsulated cross-connect terminal unit of the present invention and a terminal into which such unit can be inserted.

FIG. 3a shows a perspective view of the modular unit of the present invention.

FIG. 3b shows the modular unit of the present invention prior to installation of the cable stub and terminal blocks.

FIG. 4 shows the bottom of the enclosure of the terminal shown in FIG. 2.

DESCRIPTION OF THE PREFERRED EMBODIMENT

Referring to FIG. 1, there is shown a cross-connect terminal 10, which includes a feeder field 20 and a distribution field 30 arranged with respect to each other in a conventional manner. The fields are housed in a suitable enclosure 40. Each of the fields 20, 30, are comprised of a multiplicity of terminal blocks. In the prior art arrangement of FIG. 1, the feeder field terminal blocks are arranged in two parallel adjacent columns with the right hand column being designated as 20a and the left hand column being designated as 20b. The two columns are located in the center of the enclosure. The distribution field terminal blocks are arranged in two equal groups with the group designated as 30a being associated with and parallel to the feeder field 20a and the group designated as 30b being associated with and parallel to feeder field 20b. Each distribution field group is made up of two parallel adjacent columns having equal or unequal numbers of terminal blocks.

Identical terminal blocks are ordinarily used to embody the feeder and distribution fields. These blocks may be any one of a number of different types of blocks currently in use. For example, the blocks may be of the 50 pair quiet front type manufactured by assignee's Reliable Electric Division in Franklin Park, Ill. These types of blocks provide connection for 50 cable pairs and include on their front face 50 pairs or 100 total terminal connections of the recessed screw type.

For purposes of explanation, it will be assumed hereinafter that the feeder and distribution fields of terminal 10 are each embodied using 50 pair terminal blocks. It will also be assumed that cross-connect terminal 10 provides connection for 100 pairs in the feeder field 20. Therefore, columns 20a and 20b each include one (1) terminal block.

It has been recognized that it is necessary to have more connection points in the distribution field than in the feeder field. This allows some of the subscribers to have a second cable pair at their location. Over the years, the ratio of feeder connection points to distribution connection points has increased from 1:1 to 1:1.2 to 1:1.5.

With the recent introduction of the Serving Area Concept in the telephone industry, it is now preferred that the ratio be 1:2. In order to preserve that ratio, the terminal 10 will have to provide connection for 200 pairs in the distribution field 30. As the distribution field is arranged in two equal groups 30a, 30b, each of the groups must provide connection for 100 pairs. Each of the groups must therefore include tow (2) terminal blocks and as each group comprises two parallel adjacent columns, then each column must include one (1) terminal block.

Cross-connect terminals may be either of the single access or double access type. In the former type, the enclosure has doors only on one of its long faces. In the latter type the enclosure has doors on both of its long faces. Such an enclosure houses up to twice as many terminal blocks as the single access type. For purposes of explanation it will be assumed that terminal 10 is of the double access type and therefore while not shown in FIG. 1 it includes a second feeder and distribution fields which are identical to fields 20 and 30 respectively. These second fields are accessible from the rear face of the enclosure. Therefore, a terminal 10 of the double access type having a 1:2 ratio of feeder field to distribution field pairs will provide connection for 200 pairs in the feeder field and 400 pairs in the distribution field.

Terminal 10 is typically mounted at ground level on a pad and to that end the terminal includes a suitably arranged base 50 to which enclosure 40 is attached. The C.O. and subscriber cable pairs are typically buried in the ground and appear at the pad for connection to the associated terminal blocks. The terminal blocks may be either prestubbed in the factory or be unstubbed. If the blocks are prestubbed the craftsperson then connects the pairs of the stub to the appropriate pairs of the appropriate cable. If the blocks are unstubbed, the craftsperson must connect the cable pairs to the rear of the blocks.

To that end the terminal blocks are mounted in the enclosure on hinged panels 40a, 40b. The blocks of column 20a and group 30a are mounted on panel 40a which is hinged (not shown) on its right hand side; whereas, the blocks of column 20b and group 30b are mounted on panel 40b which is hinged (not shown) on its left hand side. The panels may then be rotated outward about the center line between columns 20a and 20b to thereby expose the backs of the blocks. The panels are hinged in the manner described above, even if the terminal is prestubbed in the factory.

After connecting the rear of the blocks to the appropriate cable pairs of the appropriate cable the craftsperson must then interconnect by the use of jumpers the appropriate pairs of the feeder field to the appropriate pairs of the distribution field. The requirements that must be observed by a craftsperson in connecting the jumpers are that jumpers should never cross over between adjacent blocks and that jumpers should never cross over the center line between columns 20a and 20b of the feeder field.

Jumpers may connect a pair of connection points in column 20a (20b) to a pair of points in group 30a (30b). Jumpers may also be used to connect a pair of points in column 20a (20b) to a pair of points in group 30b (30a). Jumpers may also be used to connect a pair of points in column 20a (20b) to a pair of points in a group located on the other side of the enclosure. Quite similarly, a C.O. pair located on the other side of the enclosure may be connected to a pair located in either group 30a or 30b. To ensure an orderly routing for the jumpers, terminal 10 includes in the enclosure a number of channels 40c, 40d, 40e. Each of the channels contains rings 40f in order to contain the jumpers.

U-shaped channel 40c has a first vertically mounted portion which is located to the right of the hinge of hinged panel 40a, a second vertically mounted portion which is located to the left of the hinge of hinged panel 40b, and a third horizontally mounted portion which is located below the hinged panels and below the first and second vertical portions. The first and second vertical portions do not extend the entire height of the enclosure but have a small opening at the top in order to allow jumpers to be routed to the other side of the terminal. Substantially L-shaped channel 40d is included on panel 40a and has a vertical portion between column 20a and group 30a and a horizontal portion below the blocks. Substantially L-shaped channel 40e is included in panel 40b and has a vertical portion between column 20b and group 30b and a horizontal portion below the blocks.

Referring now to FIG. 2 there is shown a cross-connect terminal 100 which utilizes the modular encapsulated cross-connect terminal units of the present invention. For ease of comparison with the prior art terminal of FIG. 1, those parts of the terminal of FIG. 2 which are identical in structure to the prior art terminal carry the same reference numerals. Therefore terminal 100 of FIG. 2 includes a feeder field 20 and a distribution field 30 both of which are housed in an enclosure 40. The terminal includes a suitable base 50 and the enclosure includes lifting rails 60.

While terminal 10 includes hinged panels 40a, 40b to allow access to the rear of the terminal blocks in the feeder and distribution fields, terminal 100 does not include such hinged panels because of the modular nature of the terminal units used therein. The feeder field terminal blocks comprise one such modular unit. Each of the distribution field groups 30a, 30b also comprise individual modular units. Terminal 100 is therefore made up of three modular units. As all of the modular units are identical in structure they all are designated as 110.

FIG. 2 shows in some detail the modular unit 110 corresponding to distribution field group 30a. Further details of modular unit 110 are shown in FIGS. 3a and 3b. For ease of explanation it will be assumed that FIGS. 3a and 3b show the modular unit 110 corresponding to distribution field group 30a. It should, however, be appreciated that the modular units for the feeder field 20 and distribution field group 30b are identical to the modular unit for group 30a. That modular unit will now be described with reference to FIGS. 2, 3a and 3b.

Unit 110 includes a base 120 having a front face 120a, a rear face 120b, right and left sides 120c and 120d, respectively, and a bottom face 120e. Extending outwardly from the bottom edge of the rear face is flange 122. Bottom face 120e has a substantially circular hole 124 in its center. The diameter of the hole is dependent on the thickness of the cable stub 126 to be inserted therein. A substantially rectangular plate 128 is anchored to the bottom face in order to firmly attach the cable stub 126 to that face.

The front face 120a of base 120 includes rings 40f which are used to contain the jumpers which interconnect the feeder and distribution fields. Rings are also included on the rear of base 120. Additional sets of rings are included on removable vertical panels 40i g, 40h. Panel 40g separates the distribution field group 30a from feeder field 20 and panel 40h separates the feeder field from distribution field group 30b. Additional rings are contained on vertical panels 40i and 40j. These panels correspond to the vertical portions of U-shaped channel 40c (see FIG. 1).

Extending upward from planes substantially near the top edges of front and rear faces of modular unit base 120 is frame 130. The terminal blocks comprising group 30a are mounted to the frame. In order to facilitate connection of the cable stub to the rear of the blocks and encapsulation of those connections, frame 130 includes front and rear hinged panels 130a and 130b. Panel 130a includes at its upper end a flange 130c having one or more suitably arranged holes therein.

Each of the panels has first and second hollow block mounting sections which are substantially rectangular in shape. The terminal blocks of group 30a are mounted in these hollow sections. Typically the panels 130a, 130b are rotated on their associated hinges 130d, 130e to the horizontal position prior to installation of the blocks in the hollow sections (see FIG. 3b). The blocks are then placed in the hollow sections with the rear face of the blocks facing upwards. The blocks are then secured to their associated panels through the use of a suitable fastener (not shown).

After the terminal blocks are mounted in the hollow sections of hinged panels 130a and 130b, the cable stub 126 is anchored to bottom face 120e by plate 128. The pairs of the stub are then connected to appropriate connectors on the rear face of the blocks. Such connection may be accomplished by wire wrapping or any other technique dependent mainly on the type of connector on the rear face. After connection the cable pairs are then dressed to the associated rear face. The rear of the blocks are now ready to be encapsulated. Prior to the pouring of the encapsulant the hinged panels may be rotated upwards to a position such that they are at a shallow acute angle with respect to the horizontal. This rotation reduces the amount of encapsulant that must be used as the top end of the blocks need not be encapsulated to the same depth as the lower end. The dressed cable pairs are adjacent to the lower end and they must be completely covered by the compound. The encapsulating compound is then poured over those connections in a manner such that all of the connectors on the rear face of the blocks and the dressed cable pairs are completely covered by the encapsulant. After the encapsulant has cured the panels 130a and 130b are then rotated on their hinges to the vertical position and are held in that position by L shaped members 132 and 134 (see FIG. 3a). Encapsulant is then poured into base 120 thereby encapsulating the cable stub.

As shown most clearly in FIG. 4, the bottom of terminal enclosure 40 is divided into two essentially equal portions, 40m and 40n. Portion 40m is permanently fixed to the enclosure. Portion 40n is slidably removable therefrom. Included in the bottom of the assembled enclosure are three substantially rectangular openings 40o which each correspond to rectangular plate 128 (See FIG. 3a). For purposes of illustration the encapsulant in base 120 FIG. 3a has not been shown in order that the means by which the cable stub is connected to the bottom of the base may be shown.

After the encapsulant has completely cured, unit 110 may then be slid into terminal 100 and secured in place. Bottom portion 40n is first removed from the enclosure. This ensures that unit 110 can be slid into the terminal without damage to the cable stub 126. Portion 40n may then be slid back into place just below the bottom edges of panels 40g, h, i, j and base 120. The cable stub 126 projects through opening 40o into base 50. A craftsperson is then able to connect the pairs of the stub to the appropriate pairs of the appropriate cable appearing at the base. Unit 110 is held in place in the enclosure by the combination of the interaction of flange 122 and the bottom portion 40m; by the interaction of flange 130c on hinged panel 130a with an upper mounting strip 40k on the front of the enclosure (see FIG. 2); and by the support provided by bottom portions 40m and 40n. In particular, both flange 122 and bottom portion 40m; and flange 130c and mounting strip 40k may include one or more holes arranged such that when unit 110 is properly inserted in the terminal, the holes are in alignment. One or more screws or other suitable fastening means may then be used to secure the flanges 122, 130c to the associated parts of the enclosure.

It is to be understood that the description of the preferred embodiment is intended to be only illustrative, rather than exhaustive, of the present invention. Those of ordinary skill will be able to make certain additions, deletions, and/or modifications to the embodiment of the disclosed subject matter without departing from the spirit of the invention or its scope, as defined by the appended claims.

What is claimed is:

1. A modular encapsulated terminal unit and terminal for receiving the same
   I. said encapsulated terminal unit comprising:
      (a) an open top enclosure of predetermined shape, said enclosure having
         a bottom having an opening therein, said enclosure also having a top peripheral edge;
      (b) a first panel connected by hinge means to a portion of said top peripheral edge, said panel having at least a first hollow section therein;
      (c) means for holding said hinged panel in a vertical position, said panel being rotatable on said hinge means;
      (d) a first connector block having a multiplicity of connection means on its front and rear faces, said block being mounted in said first hollow section such that said front face is facing outwardly when said panel is in the vertical position; and
      (e) a cable stub having a multiplicity of cable pairs therein, said stub being mounted to said bottom such that said cable pairs project through said opening; at least some of said cable pairs being connected to said rear face connection means in a predetermined arrangement, said rear face connection means being encapsulated and said enclosure being filled with encapsulating material to encapsulate said cable stub after said cable pairs are connected to said rear face;
   II. said terminal forming a housing for receiving said modular encapsulated terminal unit, said terminal comprising:
      (a) an enclosure comprising:
         (i) a bottom divided into first and second sections, said bottom having a plurality of openings therein, each of said openings shaped to receive a part of said terminal unit enclosure, a portion of said opening being associated with said first section the remainder of said opening being associated with said second section; and
         (ii) an upstanding housing circumscribing said bottom, said first section being rigidly affixed to said housing, said second section being supported by said housing and slidably removable from said enclosure to thereby allow said part of said modular terminal unit to be inserted in one of said openings.

2. A modular encapsulated cross-connect terminal unit for mounting in a cross-connect terminal, said terminal forming a housing for receiving said modular unit, said unit comprising:

I. first means comprising:
(a) an open top enclosure of predetermined shape, said enclosure having a bottom having an opening therein, said enclosure also having a top peripheral edge;
(b) first and second panels, at least said first panel being connected by hinge means to an associated portion of said top peripheral edge, said first panel having at least one hollow section therein and being mounted for pivotal motion about said hinge means between vertical and horizontal positions, said second panel being connected by connection means to an associated portion of said top peripheral edge, said connection means allowing said second panel to be in at least said vertical position;
(c) at least one connector block having a multiplicity of connection means on its front and rear faces, said block being mounted in said at least one hollow section such that said rear face is projecting upwardly when said first panel is in said horizontal position;
(d) a cable stub having a multiplicity of cable pairs therein, said stub being mounted to said bottom such that said cable pairs project through said opening, at least some of said cable pairs being connected to said rear face connection means in a predetermined arrangement; and
(e) means connected to both said first and said second hinged panels for holding said first and said second hinged panels in said vertical position, said rear face connection means being encapsulated and said enclosure filled with encapsulating material to encapsulate said stub after said cable pairs are connected to said rear face; and II. second means attached to said first means for mounting said terminal unit in said terminal with the cable stub extending through an opening in said terminal.

3. The terminal unit of claim 2 wherein said second means is attached to said first means at said enclosure.

4. The terminal unit of claim 2 wherein said second panel connection means is a hinge means, said second panel being mounted for pivotal motion about said hinge means between said vertical and said horizontal positions.

5. The terminal unit of claim 4 wherein said second panel also has at least one hollow section therein.

6. The terminal unit of claim 5 further comprising another of said at least one connector block having a multiplicity of connection means on its front and rear faces, said block being mounted in said hollow section of said second hinged panel such that said rear face is facing upwards when said panel is in the horizontal position and other of said cable stub pairs are also connected to rear face connection means of said block mounted in said second hinged panel hollow section, said rear face connection means of said another block also being filled with encapsulating material after said other cable pairs are connected.

7. The terminal unit of claim 2 wherein said predetermined shape of said enclosure is essentially rectangular.

8. A method of manufacturing a modular encapsulated cross-connect terminal unit for mounting in a cross-connect terminal, said terminal forming a housing for receiving said unit, said encapsulated unit comprising a first means comprising an open top enclosure having a bottom having an opening therein, said enclosure also having a top peripheral edge, first and second panels, at least said first panel being connected by hinge means to an associated portion of said top peripheral edge, at least said first panel being mounted for pivotal motion about said hinge means between vertical and horizontal positions, said first panel having at least one hollow section therein, said second panel being connected by connection means to an associated portion of said top peripheral edge, said connection means allowing said second panel to be in at least said vertical position, means for holding said first and said second panels in said vertical position, and second means attached to said first means for mounting said unit in said terminal with a cable stub extending through an opening in said terminal, the method comprising the steps of:
(a) mounting a connector block having front and rear faces in said at least one hollow section when said first panel is in a horizontal position, the block being mounted with its rear face upwards, said block having a multiplicity of connection means on its front and rear faces;
(b) mounting said cable stub having a multiplicity of cable pairs therein to said enclosure bottom such that said cable pairs project through said opening;
(c) connecting at least some of said cable pairs to said connector block rear face connection means in a predetermined arrangement;
(d) encapsulating said rear face connection means;
(e) rotating said first hinged panel to said vertical position; and
(f) connecting said holding means to both said first and said second panels to thereby hold said panels in said vertical position.

9. The method of claim 8 wherein said rotating step is performed only after said encapsulant has cured.

10. The method of claim 8 including the step of encapsulating said enclosure after said step of connecting said holding means to both said first and said second panels has been performed.

11. The method of claim 8 including the step of rotating said first panel to a shallow acute angle with respect to the horizontal prior to performing said encapsulating step.

12. The method of claim 8 including the step of dressing said cable pairs after performing said cable pairs connecting step.

* * * * *